(12) United States Patent
Bera et al.

(10) Patent No.: US 8,236,105 B2
(45) Date of Patent: Aug. 7, 2012

(54) APPARATUS FOR CONTROLLING GAS FLOW IN A SEMICONDUCTOR SUBSTRATE PROCESSING CHAMBER

(75) Inventors: Kallol Bera, San Jose, CA (US);
Heeyeop Chae, San Jose, CA (US);
Hamid Tavassoli, Cupertino, CA (US);
Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1870 days.

(21) Appl. No.: 10/821,310

(22) Filed: Apr. 8, 2004

(65) Prior Publication Data

US 2005/0224180 A1    Oct. 13, 2005

(51) Int. Cl.
*C23C 16/455* (2006.01)
*C23C 16/52* (2006.01)
*C23F 1/00* (2006.01)
*H01L 21/306* (2006.01)
*C23C 16/06* (2006.01)
*C23C 16/22* (2006.01)

(52) U.S. Cl. .................... 118/715; 156/345.29

(58) Field of Classification Search .................. 118/715; 156/345.43–345.47, 345.29
See application file for complete search history.

(56) References Cited

U.S. PATENT DOCUMENTS

| | | | |
|---|---|---|---|
| 5,441,568 A | 8/1995 | Cho et al. | |
| 5,516,367 A | 5/1996 | Lei et al. | 118/725 |
| 5,788,799 A | 8/1998 | Steger et al. | 156/345.37 |
| 5,885,356 A | 3/1999 | Zhao et al. | 118/723 ER |
| 5,891,350 A | 4/1999 | Shan et al. | 216/71 |
| 5,972,114 A * | 10/1999 | Yonenaga et al. | 118/715 |
| 6,054,013 A | 4/2000 | Collins et al. | 208/408 |
| 6,156,151 A * | 12/2000 | Komino et al. | 156/345.29 |
| 6,245,190 B1 | 6/2001 | Masuda et al. | 156/345.46 |
| 6,264,788 B1 | 7/2001 | Tomoyasu et al. | 156/345.43 |
| 6,273,022 B1 | 8/2001 | Pu et al. | 118/723 I |
| 6,277,237 B1 | 8/2001 | Schoepp et al. | 156/345.1 |
| 6,448,536 B2 * | 9/2002 | Li et al. | 219/390 |
| 2002/0062848 A1 | 5/2002 | Luscher et al. | 134/33 |
| 2002/0134308 A1 | 9/2002 | Amano | |
| 2003/0094135 A1 | 5/2003 | Komiya et al. | |

FOREIGN PATENT DOCUMENTS

| | | |
|---|---|---|
| EP | 0814495 | 12/1997 |
| EP | 0855735 | 7/1998 |
| EP | 0892422 | 1/1999 |
| JP | H08008239 A | 1/1996 |
| JP | 10-321605 | 11/1998 |
| WO | WO 99/48130 | 9/1999 |

OTHER PUBLICATIONS

U.S. Appl. No. 09/519,719, filed Mar. 7, 2000, entitled: Temperature Controlled Semiconductor Processing Chamber Liner.
PCT International Search Report and Written Opinion dated Apr. 1, 2006 for PCT/US2005/011309.

(Continued)

*Primary Examiner* — Rudy Zervigon
(74) *Attorney, Agent, or Firm* — Patterson & Sheridan, LLP

(57) ABSTRACT

Apparatus for controlling the flow of a gas between a process region and an exhaust port in a semiconductor substrate processing chamber is provided. The apparatus includes at least one restrictor plate supported within the semiconductor processing chamber and at least partially circumscribing a substrate support pedestal. The restrictor plate is adapted to control the flow of at least one gas flowing between the process region and the exhaust port.

27 Claims, 5 Drawing Sheets

OTHER PUBLICATIONS

Notification of First Office Action dated Nov. 30, 2007 for Chinese Patent Application No. 2005800119113.
Official Letter dated Jul. 15, 2011, from Korean Patent Office for corresponding Korean Patent Application No. 10-2006-7023427.
Notice of final rejection from the Japanese Intellectual Property Office dated Jan. 25, 2011 for corresponding Japanese Patent Application No. 2007-507399.

* cited by examiner

APPARATUS FOR CONTROLLING GAS FLOW IN A SEMICONDUCTOR SUBSTRATE PROCESSING CHAMBER

BACKGROUND OF THE INVENTION

1. Field of the Invention

The present invention relates to a semiconductor substrate processing system. More particularly, the invention relates to a flow control assembly for controlling the flow of gases within a semiconductor substrate processing chamber.

2. Background of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and the like.

As these critical dimensions shrink, process uniformity across the substrate becomes paramount to maintain high yields. One problem associated with a conventional plasma etch process used in the manufacture of integrated circuits is the non-uniformity of the etch rate across the substrate, which may be due, in part, to a lateral offset between the reactive species and the substrate being etched. One factor contributing to the tendency of the reactive species to be offset from the center of the substrate is the radial location of the chamber exhaust port. As gases are more easily pumped from areas of the chamber that are closest to the exhaust port, the reactive species is pulled towards the exhaust port, thereby becoming offset with respect to the center of the chamber and the substrate positioned therein. This offset contributes to a loss of etch uniformity over the surface of the substrate which may significantly affect performance and increase the cost of fabricating integrated circuits.

Therefore, there is a need in the art for an improved apparatus for etching material layers during the manufacture of integrated circuits.

SUMMARY OF THE INVENTION

The present invention generally provides an apparatus for controlling the flow of gases through a semiconductor substrate processing chamber. In one embodiment of the invention, the apparatus (a flow controller) includes a base adapted to be supported by a bottom of the processing chamber and a support ring coupled to the base in a vertically spaced apart orientation. The support ring circumscribes a pedestal upon which a substrate is supported within the chamber. At least one restrictor plate is coupled to the support ring and extends radially therefrom. The restrictor plate is positioned between a processing region located above the substrate and an exhaust port that is coupled to a vacuum pump. The restrictor plate is adapted to control the flow of the gas flowing from the process region toward the exhaust port.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to an apparatus for improving process uniformity across a semiconductor substrate in a plasma reactor. Those skilled in the art will understand that other forms of plasma etch chambers may be used to practice the invention, including reactive ion etch (RIE) chambers, electron cyclotron resonance (ECR) chambers, and the like. Furthermore, the present invention may be useful in any processing chamber where flow control may improve process uniformity across the surface of a substrate during processing, such as atomic layer deposition (ALD) chambers, chemical vapor deposition (CVD) chambers, plasma enhanced chemical vapor deposition (PECVD) chambers, magnetically enhanced plasma processing chambers, and the like.

Figure 1:
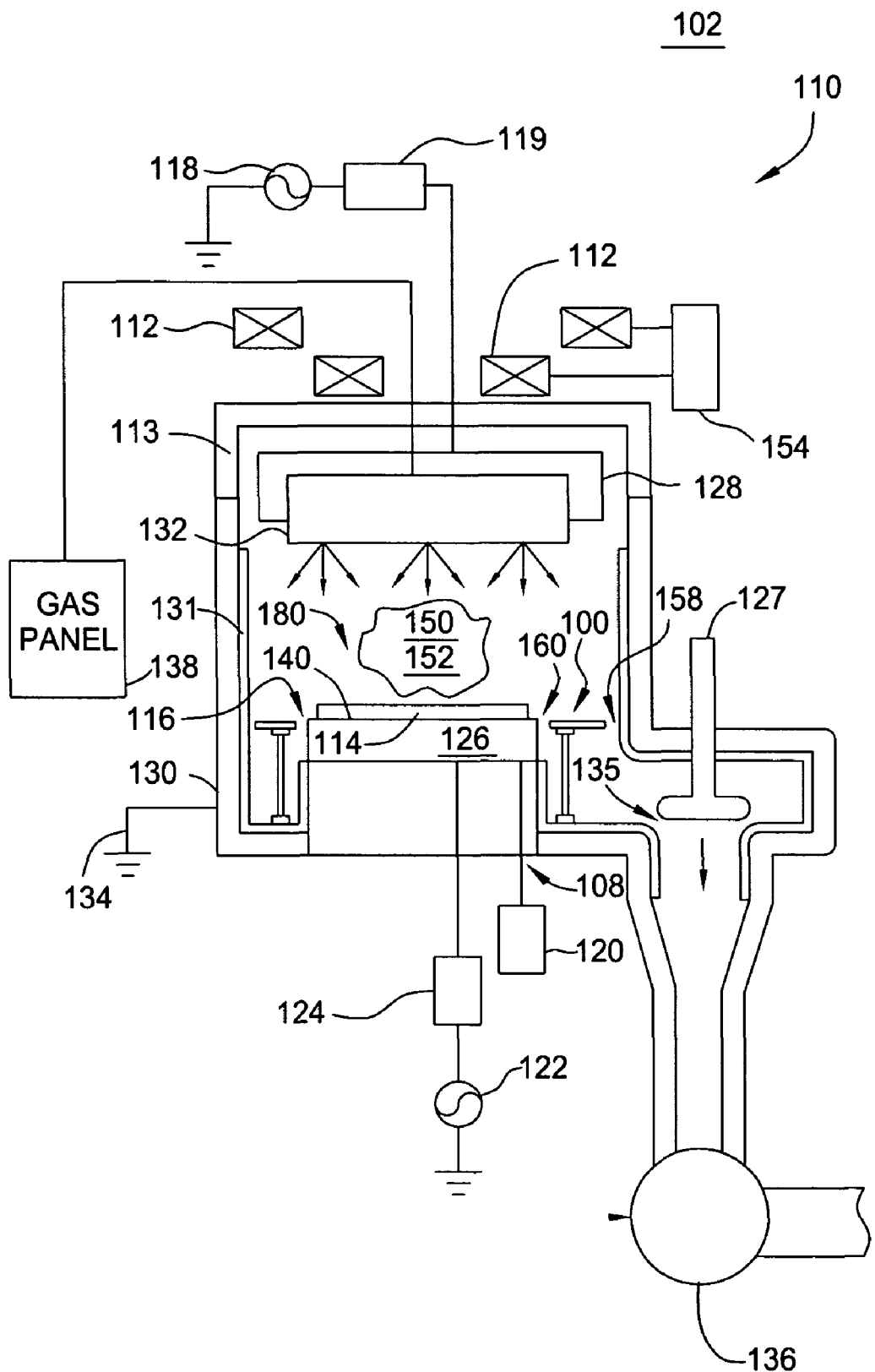
FIG. 1 is a schematic side view of a dual frequency capacitive plasma source reactor.

FIG. 1 depicts a schematic, cross-sectional diagram of a dual frequency capacitive plasma source reactor utilizing the present invention. In one embodiment, the flow controller of the present invention works with chambers having a gas inlet located above a substrate support and a chamber exhaust or exhaust port located below the substrate support. The flow controller is useful wherever controlled gas flow through a process chamber is desirable. One example of a processing chamber suitable for use with the present invention is the ENABLER™ processing chamber available from Applied Materials, Inc., of Santa Clara, Calif.

In one embodiment, a reactor 102 comprises a process chamber 110 having a conductive chamber wall 130 that is connected to an electrical ground 134 and at least one solenoid segment 112 positioned exterior to the chamber wall 130. The chamber wall 130 comprises a ceramic liner 131 that facilitates cleaning of the chamber 110. The byproducts and residue of the etch process are readily removed from the liner 131 after each substrate is processed. The solenoid segment(s) 112 are controlled by a DC power source 154 that is capable of producing at least 5V.

Process chamber 110 also includes a substrate support pedestal 116 disposed on a bottom 108 of the process chamber 110 and spaced apart from a showerhead 132, defining a process region 180 therebetween. The substrate support pedestal 116 comprises an electrostatic chuck 126 for retaining a substrate 114 on a surface 140 of the pedestal 116 beneath the showerhead 132.

The electrostatic chuck 126 is controlled by a DC power supply 120 and the support pedestal 116, through a matching network 124, which is coupled to an RF bias source 122. The bias source 122 is generally capable of producing an RF signal having a tunable frequency of 50 kHz to 13.56 MHz and a power of between 0 and 5000 Watts. Optionally, the bias source 122 may be a DC or pulsed DC source.

The showerhead 132 may comprise a plurality of gas distribution zones such that various gases can be supplied to the processing region 180 of the chamber 110 using a specific gas distribution gradient and is mounted to an upper electrode 128 that opposes the support pedestal 116. The upper electrode 128 is coupled to an RF source 118 through an impedance transformer 119 (e.g., a quarter wavelength matching stub). The source 118 is generally capable of producing an RF signal having a tunable frequency of about 162 MHz and a power between about 0 and 2000 Watts.

The interior of the chamber 110 is a high vacuum vessel that is coupled to a vacuum pump 136 through an exhaust port 135 formed in the chamber wall 130. A throttle valve 127 disposed in the exhaust port 135 is used in conjunction with the vacuum pump 136 to control the pressure inside the processing chamber 110.

A flow controller 100 circumscribes the support pedestal 116 in a spaced apart relation to the support pedestal 116 and the chamber wall 130. The flow controller 100 controls the flow of gas flowing between the process region 180 and the exhaust port 135. The flow controller 100 generally is configured to control flow characteristics in a particular chamber or under certain process conditions. The flow controller may be configured to equalize gas flow characteristics within the particular chamber or to maintain a desired asymmetric gas flow. This is accomplished by configuring the flow controller to a predetermined height, width, and profile which maintains the flow controller at a predefined height relative to the bottom 108 of the chamber and which creates a predefined gap 158 between an outer edge of the flow controller 100 and an inner edge of the chamber wall 130 and a predefined gap 160 between an inner edge of the flow controller 100 and an outer edge of the support pedestal 116. The flow controller may be configured such that either or both of the gaps 158, 160 may be of varying width along the circumference of the flow controller 100.

Figure 2A:
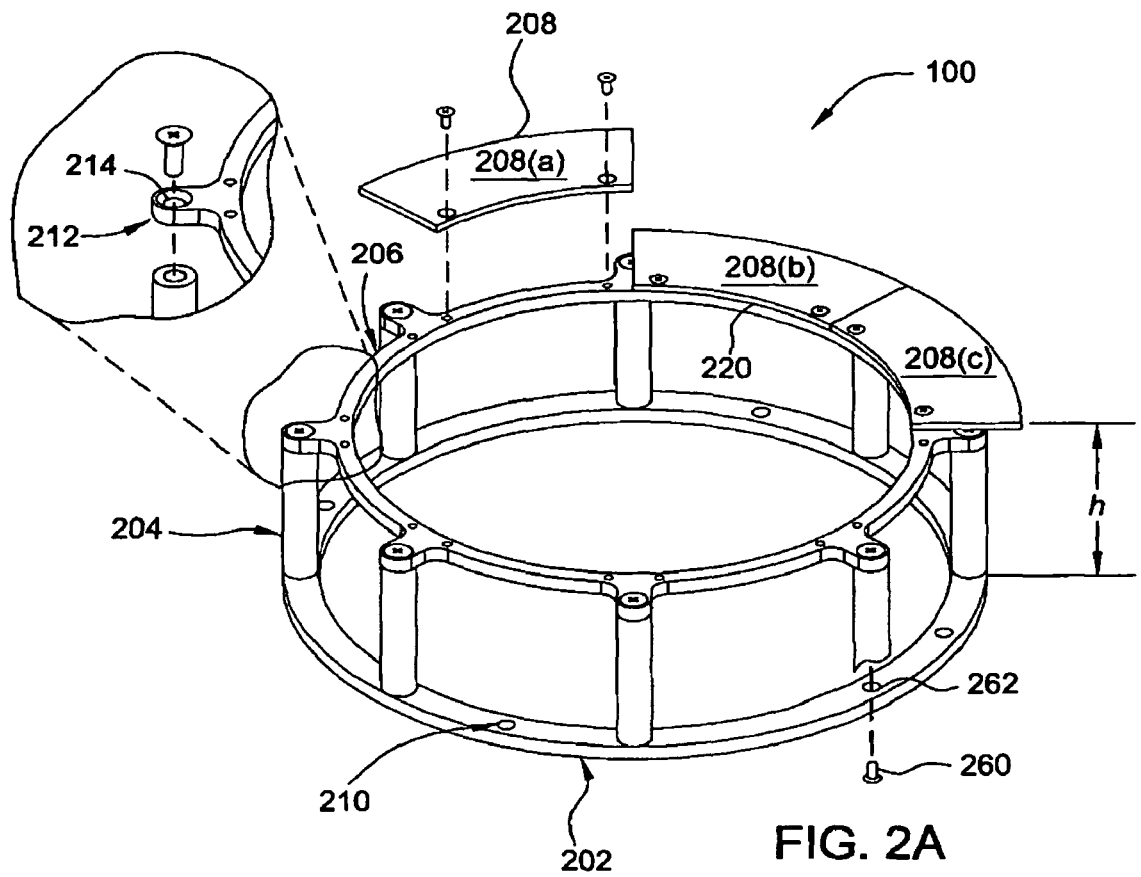
FIG. 2A is an isometric, partially-exploded view of one embodiment of a flow controller.

FIG. 2A depicts an isometric, partially-exploded view of one embodiment of the flow controller 100. The flow controller 100 comprises a base plate 202, a plurality of support pins 204, a support ring 206, and at least one restrictor plate 208. The base plate 202 is disposed on the bottom 108 of the process chamber 110 (shown in FIG. 1) and generally circumscribes the substrate support pedestal 116. The base plate 202 may be fastened to the bottom 108 in a suitable manner such as bolts, screws, adhesive, welding, clamps, and the like. In the embodiment shown in FIG. 2A, four holes 210 are provided through the base plate 202 to facilitate bolting the base plate 202 to the bottom 108 of the process chamber 110. It is contemplated that a plurality of base plates may be used to support the flow controller 100 on the chamber bottom 108.

The support pins 204 are coupled between the base plate 202 and the support ring 206 to space the support ring 206 firmly in place above the base plate 202. The support pins 204 may be coupled to the base plate 202 and the support ring 206 in a suitable manner, such as by welding, screwing, staking, interference fit, bolting, bonding, and the like. Alternatively, the support pins 204 may be an integral part of either the base plate 202 or the support ring 206, or both, such as a molding, casting, forging, or machined from a single block of material. In the embodiment shown in FIG. 2A, the support pins 204 are bolted substantially perpendicularly to the base plate 202 through holes 262 formed in the base plate 202 beneath each of the support pins 204 by fasteners 260 (one is shown). The support pins 204 are coupled to the support ring 206 along numerous projections 212 having a hole 214 for bolting the support ring 206 to the support pin 204.

The support pins 204 are typically about equal in length and hold the support ring 206 substantially parallel to, and at a height h above, the bottom 108 of the processing chamber 110. Typically, the height h is varied to optimize the gas flow characteristics to the pump in a particular processing chamber. For example, the height may be selected such that the restrictor plate 208 is approximately even with and substantially parallel to the upper surface of the substrate 114 disposed on the pedestal 116. Alternatively, the height may be higher or lower depending upon the flow characteristics and process chamber geometry. A flow simulation software package may be used to determine the optimum height h for the flow controller 100. Alternatively, multiple sets of support pins 204 made at different lengths may be used to run experimental processes to determine the optimum height h. Alternatively, the support pins 204 may be adjustable in length, such as by a jackscrew, so as to allow alteration of the height h without the use of different support pins 204. In yet another embodiment, the support pins 204 of varying height may be used to orient the angle of the restrictor plate(s) 208 with respect to the pedestal surface 140 such that the restrictor plate(s) 208 are not parallel with the pedestal surface 140 and the surface of the substrate being processed.

The at least one restrictor plate 208 operates as a baffle to alter the flow of gases passing over and around it. The restrictor plate(s) 208 restrict gases flowing from the gas inlet to the exhaust port and is configured to provide uniform gas flow over the surface of the substrate 114 by providing maximum restriction of the gas flow near the exhaust port and minimal restriction to flow opposite the exhaust port. The uniform gas flow alleviates the tendency of the plasma to be pulled towards the exhaust port.

In one embodiment, the at least one restrictor plate 208 is an annular ring segment oriented towards the exhaust port and leaving open the area opposite the exhaust port. Alternatively, the at least one restrictor plate 208 may be a plurality of annular ring segments of the same or varying radial widths disposed proximate each other to form an annular ring segment of the desired size and profile to optimize gas flow within the chamber during processing. Alternatively, the restrictor plate 208 may be a singular plate with a uniform or varying radial width oriented such that the maximum gas flow restriction is proximate the exhaust port and the minimum gas flow restriction is opposite the exhaust port. It is contemplated that other configurations may be utilized in processing chambers with different geometries and varying exhaust port locations and or numbers.

The at least one restrictor plate 208 is coupled to the support ring 206 and may be attached in any conventional manner such as by bolting, screwing, bonding, taping, and the like. It is contemplated that the restrictor plate may be coupled directly to the support pins 204 or the base 202. In the embodiment depicted in FIG. 2A, the restrictor plates 208 are bolted through holes formed in the projections 212 in the support ring 206 such that an inner edge 220 of the restrictor plates 208(a)-(c) is maintained substantially close to an outer edge of the substrate support pedestal 116, defining an inner gap 160 therebetween (shown in FIG. 1). The inner gap 160 is generally sufficiently small to substantially prevent gas flow therethrough but may be varied in size to optimize the gas flow in a particular processing chamber.

In the embodiment depicted in FIG. 2A, the restrictor plates comprise a series of plates 208(a)-(c) coupled to the support ring 206 and arranged next to each other to form an arc of a desired size. The particular size of the arc, or the sweep angle, will vary depending upon the process chamber geometry. The restrictor plates 208 shown in FIG. 2A sweep an angle of 45 degrees, such that the three restrictor plates 208(a), (b), (c) together comprise 135 degrees. However, the restrictor plates could be larger or smaller, or of varying profiles, leaving larger or smaller gaps as needed to optimize the pressure and flow in a particular chamber.

Figure 2B:
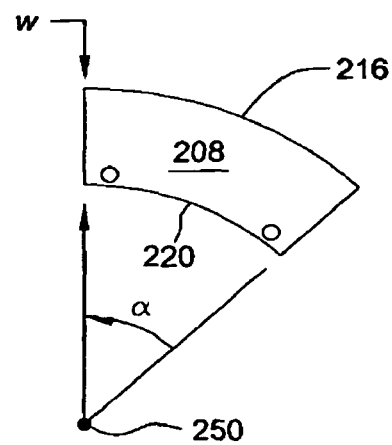
FIG. 2B is a plan view of one embodiment of a flow restrictor plate of the flow controller of FIG. 2A.

FIG. 2B, for example, depicts a plan view of one embodiment of a restrictor plate 208 for use in the flow controller 100. The size of the restrictor plate 208 is defined by an angle, α, measured from a center point 250, and a width, w, measured radially with respect to the center point 250. Altering the angle, α, will allow greater or lesser blockage of the air flow by a single plate. A smaller angle, α, allows for greater fine-tuning of the flow restrictor, while a larger angle, α, reduces parts. This allows for adjustment to find the optimum configuration. Moreover, once a particular configuration is determined, a single restrictor plate 208 may be fabricated with the angle, α, necessary to cover the desired area by itself.

In addition, altering the width w changes the size of the gap 158 defined between an outer edge 216 of the flow restrictor 208 and the liner 131 of the chamber wall 130 (see FIG. 1). This allows control of the gas flow around the outer edge 216 of the flow restrictor and through the gap 158. In one embodiment, the width w of the restrictor plate 208 is sufficient to substantially close the gap 158, thereby substantially restricting gas flow through the gap 158. The gap 158 may be uniform or it may vary along the periphery of the flow restrictor plate or plates. The variation in the size of the gap 158 may be smooth, such as by using one or more restrictor plate(s) with a tapering width. Alternatively, the variation in the size of the gap 158 may be stepped, such as by using multiple restrictor plates each with a different width.

Figure 3:
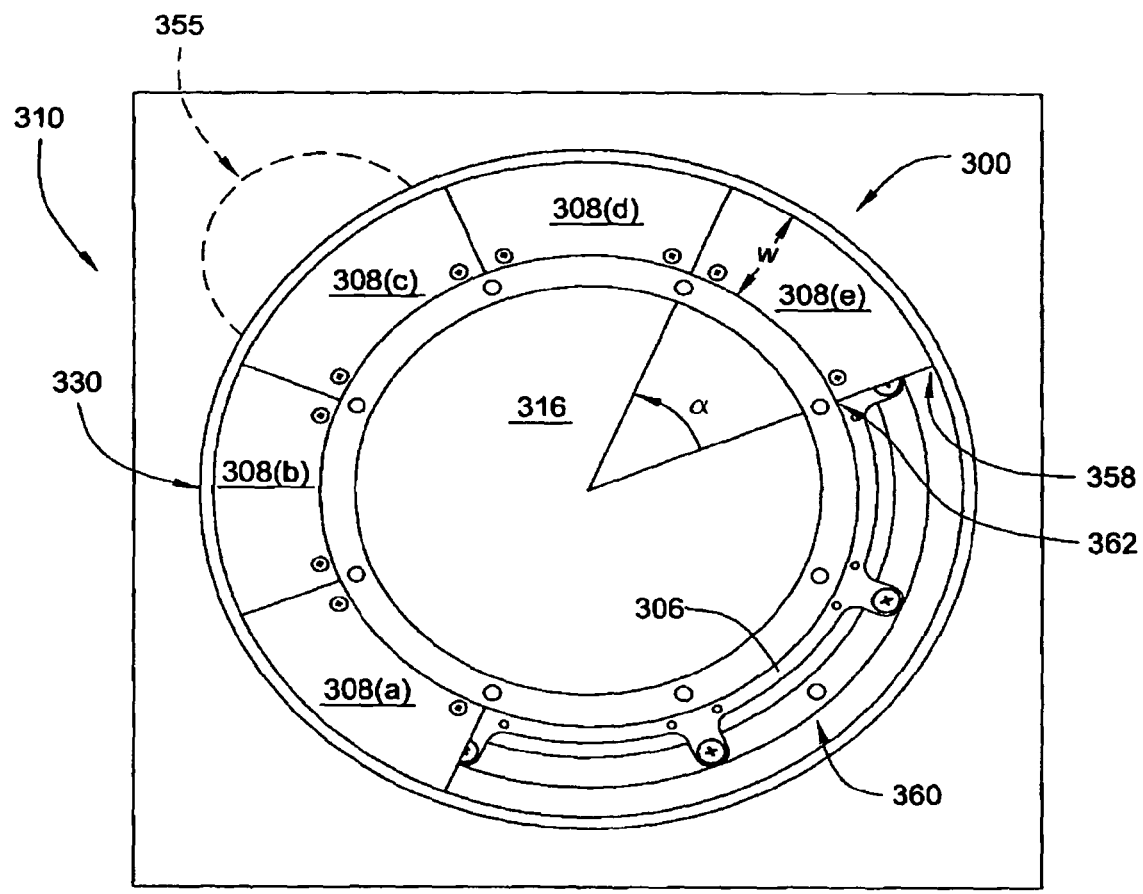
FIG. 3 is a sectional plan view of a processing chamber utilizing one embodiment of a flow controller.

FIG. 3 depicts a plan view of one embodiment of a flow controller 300 disposed in a processing chamber 310. This embodiment illustrates how a series of restrictor plates 308(a)-(e) can be arranged on a support ring 306 to control the pressure and velocity of air flowing over the surface of a substrate (not shown) disposed on a pedestal 316 in the processing chamber 310.

In this embodiment, five restrictor plates 308(a)-(e) are abutted to substantially surround the pedestal 316. Each restrictor plate has an angle, α, of about 45 degrees, such that the assembled restrictor plates 308 surrounds about 225 degrees, or about ⅝ of the pedestal 316. Each restrictor plate also has a width, w, sufficient to substantially close a gap 358 defined between an outer edge of the restrictor plates 308 and the chamber wall 330. The restrictor plates 308 are situated such that a gap 362 defined between an inner edge of the restrictor plates and an outer edge of the pedestal 316 is substantially closed. The restrictor plates 308 are arranged such that they leave an opening 360 which is substantially diametrically opposed to the location of a exhaust port 355 disposed in the processing chamber 310, thus allowing air to flow more freely past the pedestal through the opening 360 than through the gaps 358, 362.

Figure 4A:
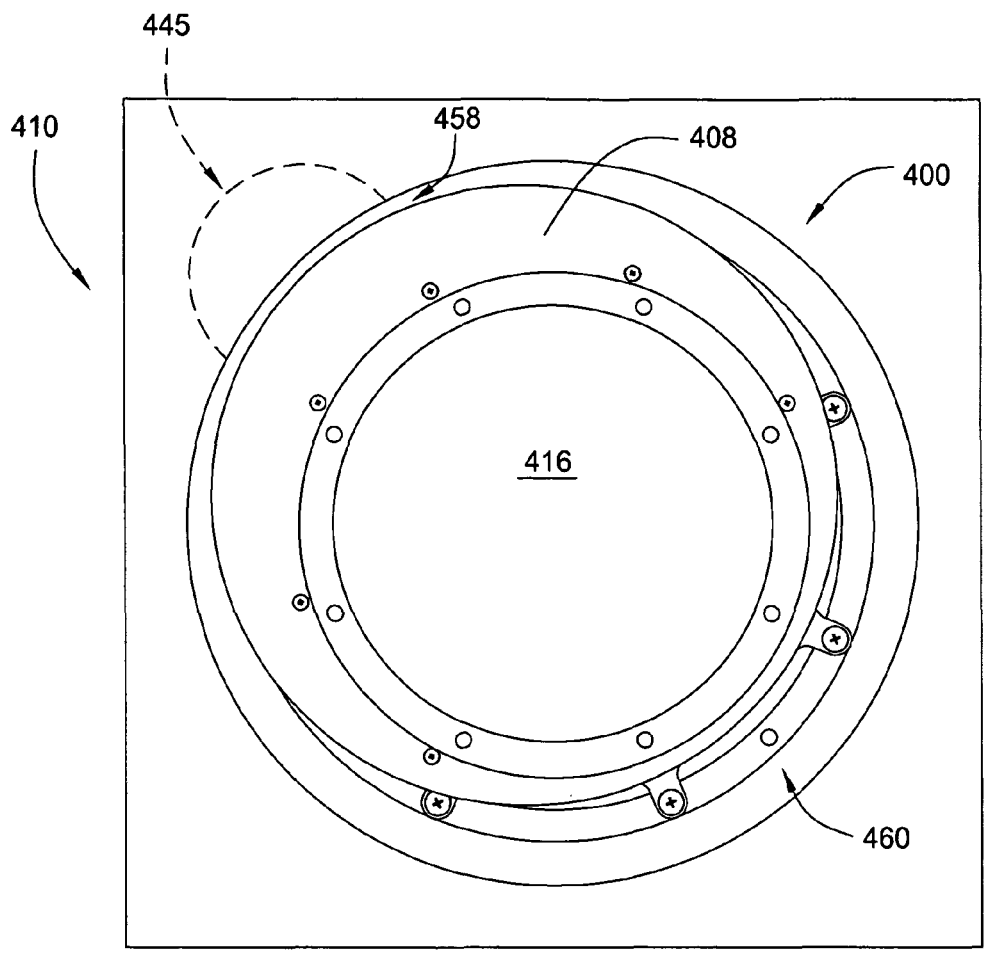
FIG. 4A is a sectional plan view of a processing chamber utilizing another embodiment of a flow controller.

FIG. 4A depicts a plan view of another embodiment of a flow controller 400 disposed in a processing chamber 410. In this embodiment, the restrictor plate 408 is a unitary component which has an annular profile for optimizing air pressure and velocity across the surface of a substrate disposed on a pedestal 416 in a processing chamber 410. The width, w, of the restrictor plate 408 may vary in any amount, smoothly or discontinuously, along any radial section. In the embodiment depicted in FIGS. 4A and 4B, the width of the restrictor plate 408 tapers smoothly from a maximum width $w_1$ to a diametrically opposed minimum width $w_2$. The restrictor plate 408 is oriented such that the maximum width $w_1$ is disposed proximate the exhaust port 445, leaving only a small gap 458 near the exhaust port and a much larger opening 460 disposed opposite the exhaust port 445.

For example, in a chamber 410 having a chamber wall 430 inner diameter of 22 inches and having a 15 inch diameter pedestal 416 disposed therein, the resultant channel between the pedestal 416 and the chamber wall 430 is 3½ inches wide. An exemplary flow controller 400 may be configured to have a circular shape having an outer diameter of 18 inches, with a maximum width $w_1$ of 2¾ and a diametrically opposed minimum width $w_2$ of ¼ inch, with the width uniformly tapering therebetween. The flow controller 400 may be positioned in the chamber 410 such that the maximum width $w_2$ is positioned proximate the exhaust port 445, leaving a minimum gap 458 of ½ inch in the region proximate the pump port 445. The opening 460 opposite the pump port 445 is 3¼ inches wide.

Alternatively, the restrictor plate 408 could be comprised of a plurality of ring segments of different widths to approximate the oval profile. The approximation may be smooth or stepped. The profile of restrictor plate 408 could be obtained through a flow modeling software package or through experimentation with multiple restrictor plates until a desired profile is obtained.

Figure 4B:
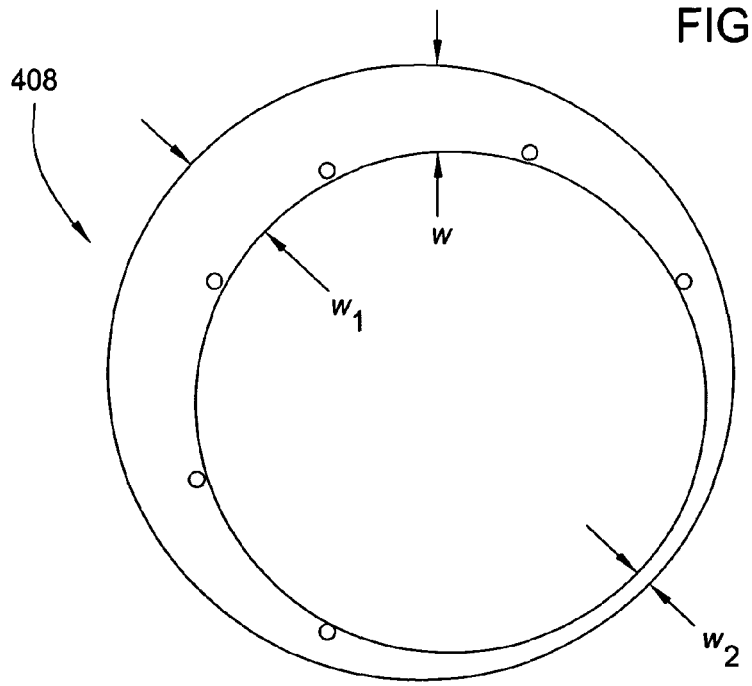
FIG. 4B is a plan view of one embodiment of a restrictor plate of the flow controller of FIG. 4A.

FIG. 4B is a plan view of the restrictor plate 408 of the flow controller 400. In another embodiment, a unitary restrictor plate may be of other oval profiles. Oval, as used here, is to be construed broadly and means any oblong, elliptical, circular, arcuate or rounded shape. The term "profile" refers to the overall general shape and may include a cutout portion for abutting the flow restrictor to a substrate support pedestal.

Referring back to FIGS. 1 and 2A, in operation, a substrate 114 is placed on the support pedestal 116, the interior atmosphere of the chamber 110 is pumped to a pressure that is less than atmospheric pressure, and a gas 150 (e.g., argon, chlorinated gas, fluorinated gas, and the like), which when ignited produces a plasma, is provided to the process chamber 110 from a gas panel 138 via the showerhead 132. The gas 150 is ignited into a plasma 152 in the process chamber 110 by applying the power from the RF source 118 to the upper electrode 128 (anode). A magnetic field is applied to the plasma 152 via the solenoid segment(s) 112, and the support pedestal 116 is biased by applying the power from the bias source 122.

As the gas 150 is introduced into the process chamber 110 to form the plasma 152 during processing of the substrate 114, the operating pressure of the process chamber 110 is maintained by the throttle valve 127 disposed in the exhaust port 135 which regulates the volume of air being pumped out of the chamber 110 through the exhaust port 135 by the pump 136. Without the use of the flow controller 100, the location of the showerhead 132, pedestal 116, and exhaust port 135 causes an uneven distribution of pressure and velocity across the surface of the substrate 114 as the gases flow into and out of the process chamber 110. This uneven pressure and velocity distribution affects the location of the plasma 152 in the chamber and, therefore, the etch rate of the materials being removed from the surface of the substrate 114.

Figure 5A:
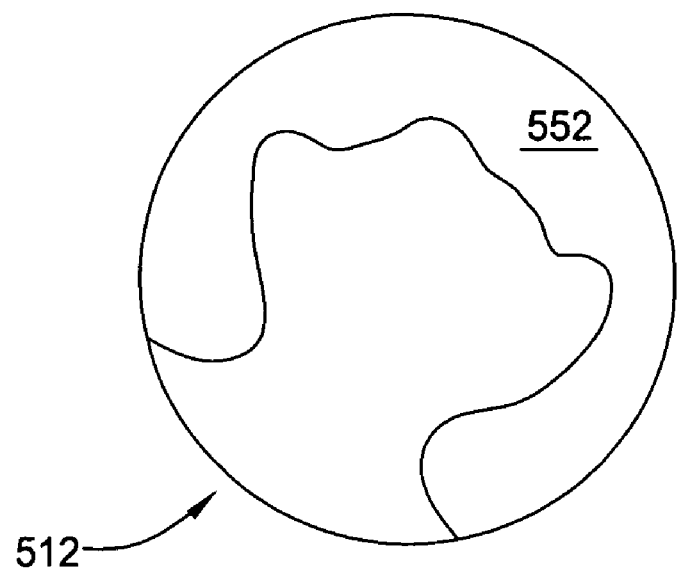
FIG. 5A is a graph depicting the etch rate uniformity across a substrate during processing in a semiconductor substrate processing chamber without the flow controller.
Figure 5B:
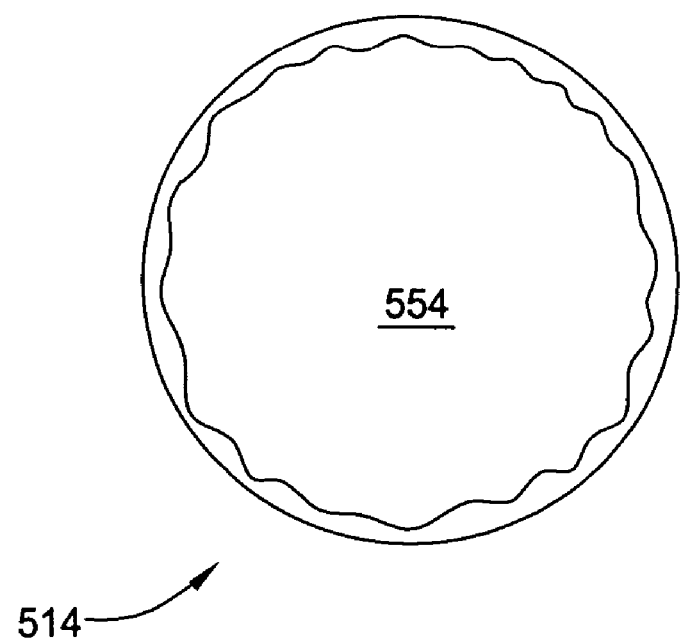
FIG. 5B is a graph depicting the etch rate uniformity across a substrate during processing in a semiconductor substrate processing chamber with the flow controller.

FIGS. 5A and 5B are graphic representations of measurements taken which show the etch rate uniformity across the surface of a substrate 114 with and without the use of a flow controller. FIG. 5A shows an area of greater etch rate 552 on the surface of a substrate 512 without the use of a flow controller. As can be seen from the figure, the reactive species has moved to one side of the substrate 512 due to the non-uniform gas flow within the chamber. This offset in location of the reactive species causes non-uniformity in the etch rate of the substrate 512, as indicated by the area of greater etch rate 552. FIG. 5B shows the improved area of greater etch rate 554 on the surface of a substrate 514 with the use of the flow controller. As can be seen in this figure, the reactive species is centered over the surface of the substrate 514 and results in a much more uniform area of greater etch rate 554.

While foregoing is directed to the various embodiments of the present invention, other and further embodiments of the invention may be devised without departing from the basic scope thereof, and the scope thereof is determined by the claims that follow.

The invention claimed is:

1. Apparatus for controlling the flow of a gas between a process region and an exhaust port in a semiconductor substrate processing chamber, comprising:
   at least one restrictor plate supported within the semiconductor processing chamber by a plurality of support pins and adapted to at least partially circumscribe a substrate support pedestal, the restrictor plate adapted to control the flow of at least one gas flowing between the process region and the exhaust port.

2. The apparatus of claim 1, further comprising:
   a base adapted to be coupled to a bottom of the processing chamber; and
   a support ring coupled to the base via the plurality of support pins in a vertically spaced apart orientation, wherein the at least one restrictor plate is coupled to the support ring.

3. The apparatus of claim 2, wherein the at least one restrictor plate is configured to be laterally spaced apart from the substrate support pedestal and an interior wall of the processing chamber.

4. The apparatus of claim 3, wherein the support pins retain the supporting ring in a non-parallel orientation with respect to a plane defined by a substrate support surface of the substrate support pedestal.

5. The apparatus of claim 1, wherein the at least one restrictor plate is one restrictor plate having an annular shape which at least partially circumscribes the substrate support pedestal.

6. The apparatus of claim 5, wherein the restrictor plate has a width that is wider at one portion of the restrictor plate than at another portion of the restrictor plate.

7. The apparatus of claim 6, wherein the portion having the wider width is adapted for positioning proximate the exhaust port.

8. The apparatus of claim 1, wherein the at least one restrictor plate further comprises a plurality of restrictor plates, wherein each restrictor plate abuts at least one other restrictor plate.

9. A semiconductor substrate processing system, comprising:
   a processing chamber;
   a substrate support pedestal disposed in the chamber;
   a gas inlet formed in the chamber above the pedestal for supplying a process gas into a process region above the support pedestal;
   an exhaust port formed in a wall of the chamber; and
   at least one restrictor plate supported within the processing chamber by a plurality of support pins and at least partially circumscribing the substrate support pedestal, the restrictor plate adapted to control the flow of at least one gas flowing between the process region and the exhaust port.

10. The system of claim 9, further comprising:
    a base adapted to be coupled to a bottom of the processing chamber; and
    a support ring coupled to the base via the plurality of support pins in a vertically spaced apart orientation, wherein the at least one restrictor plate is coupled to the support ring.

11. The system of claim 10 wherein the support pins retain the supporting ring non-parallel with respect to a plane defined by a substrate support surface of the substrate support pedestal.

12. The system of claim 9, wherein the at least one restrictor plate is a plurality of restrictor plates having an arcuate shape.

13. The system of claim 12, wherein the plurality of restrictor plates substantially surround the substrate support pedestal.

14. The system of claim 13, wherein at least a portion of an outer edge of the plurality of restrictor plates reduces a gap defined between the outer edge and an inner wall of the chamber proximate the exhaust port.

15. The system of claim 9, wherein the one restrictor plate has an annular shape which substantially surrounds the substrate support pedestal.

16. The system of claim 15, wherein the one restrictor plate has a width that is wider at one portion of the one restrictor plate than at another portion of the one restrictor plate.

17. The system of claim 16, wherein the portion having the wider width is positioned proximate the exhaust port.

18. The system of claim 17, wherein at least a portion of an outer edge of the one restrictor plate reduces a gap defined between the outer edge and an inner wall of the chamber along one section proximate the exhaust port.

19. The system of claim 9, wherein the at least one restrictor plate is one restrictor plate having an annular shape which completely surrounds the substrate support pedestal and a width that is wider at one portion of the one restrictor plate than at another portion of the one restrictor plate, and wherein a portion of an outer edge of the one restrictor plate contacts an inner wall of the chamber at least in a location proximate the exhaust port.

20. A semiconductor substrate processing system, comprising:
    a processing chamber;
    a substrate support pedestal disposed in the processing chamber;
    a gas inlet formed in the chamber above the pedestal for supplying a process gas into a process region above the support pedestal;
    an exhaust port formed in a wall of the processing chamber; and
    a restrictor plate supported within the processing chamber in a laterally space-apart relation relative to the substrate support pedestal and sidewalls of the processing chamber, wherein a first predetermined gap is between the substrate support pedestal and the restrictor plate, and a second predetermined gap is between the restrictor plate and the sidewalls of the processing chamber, and wherein the restrictor plate at least partially circumscribes the substrate support pedestal and is adapted to control the flow of at least one gas flowing between the process region and the exhaust port through the gaps.

21. The system of claim 20, wherein the restrictor plate further comprises a plurality of removable arc segments.

22. The system of claim 21 further comprising:
a plurality of support pins coupling the restrictor plate to a bottom of the processing chamber.

23. The apparatus of claim 1, wherein a length of the support pins is adjustable.

24. The apparatus of claim 1, wherein the restrictor plate has an oval profile.

25. A semiconductor substrate processing system, comprising:
a processing chamber;
a substrate support pedestal disposed in the processing chamber;
a gas inlet formed in the processing chamber above the pedestal for supplying a process gas into a process region defined in the processing chamber above the support pedestal;
an exhaust port formed in a wall of the processing chamber;
a restrictor plate supported within the processing chamber in a laterally space-apart relation relative to the support pedestal and sidewalls of the processing chamber, the restrictor plate at least partially circumscribing the substrate support pedestal and positioned above the exhaust port; and
a plurality of pins extending between the restrictor plate and a bottom of the processing chamber.

26. The apparatus of claim 1, wherein:
the at least one restrictor plate is supported within the processing chamber in a laterally space-apart relation relative to the substrate support pedestal and sidewalls of the processing chamber; and
a first predetermined gap is between the substrate support pedestal and the restrictor plate, and a second predetermined gap is between the restrictor plate and the sidewalls of the processing chamber.

27. The system of claim 9, wherein:
the at least one restrictor plate is supported within the processing chamber in a laterally space-apart relation relative to the substrate support pedestal and sidewalls of the processing chamber; and
a first predetermined gap is between the substrate support pedestal and the restrictor plate, and a second predetermined gap is between the restrictor plate and the sidewalls of the processing chamber.

* * * * *

UNITED STATES PATENT AND TRADEMARK OFFICE
CERTIFICATE OF CORRECTION

| | | |
|---|---|---|
| PATENT NO. | : 8,236,105 B2 | Page 1 of 1 |
| APPLICATION NO. | : 10/821310 | |
| DATED | : August 7, 2012 | |
| INVENTOR(S) | : Bera et al. | |

It is certified that error appears in the above-identified patent and that said Letters Patent is hereby corrected as shown below:

Column 9, Claim 20, Line 2, please delete "through the gaps";

Column 9, Claim 22, Line 5, please delete "21" and insert --20-- therefor.

Signed and Sealed this
Thirteenth Day of November, 2012

David J. Kappos
*Director of the United States Patent and Trademark Office*